United States Patent
Cheng et al.

(10) Patent No.: US 8,843,796 B2
(45) Date of Patent: Sep. 23, 2014

(54) PROFILING-BASED SCAN CHAIN DIAGNOSIS

(75) Inventors: Wu-Tung Cheng, Lake Oswego, OR (US); Yu Huang, Sudbury, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 19 days.

(21) Appl. No.: 13/158,743

(22) Filed: Jun. 13, 2011

(65) Prior Publication Data

US 2011/0307751 A1 Dec. 15, 2011

(51) Int. Cl.
*G01R 31/28* (2006.01)
*G01R 31/3185* (2006.01)
*G01R 31/3183* (2006.01)

(52) U.S. Cl.
CPC *G01R 31/318569* (2013.01); *G01R 31/318544* (2013.01); *G01R 31/318342* (2013.01)
USPC .......................................... 714/726; 714/729

(58) Field of Classification Search
None
See application file for complete search history.

(56) References Cited

U.S. PATENT DOCUMENTS

| | | | | |
|---|---|---|---|---|
| 7,263,642 | B1 * | 8/2007 | Makar et al. | 714/736 |
| 7,412,672 | B1 * | 8/2008 | Wang et al. | 716/136 |
| 7,788,561 | B2 * | 8/2010 | Huang et al. | 714/726 |
| 7,925,947 | B1 * | 4/2011 | Touba et al. | 714/732 |
| 8,280,688 | B2 * | 10/2012 | Huang et al. | 702/185 |
| 2003/0229833 | A1 * | 12/2003 | Nadeau-Dostie | 714/726 |
| 2004/0237015 | A1 * | 11/2004 | Abdel-Hafez et al. | 714/726 |
| 2005/0240848 | A1 * | 10/2005 | Cote et al. | 714/726 |
| 2006/0111873 | A1 * | 5/2006 | Huang et al. | 702/185 |
| 2006/0248418 | A1 * | 11/2006 | Gearhardt et al. | 714/726 |
| 2007/0234157 | A1 * | 10/2007 | Rajski et al. | 714/728 |
| 2009/0235134 | A1 * | 9/2009 | Guo et al. | 714/726 |
| 2010/0293422 | A1 | 11/2010 | Huang et al. | |
| 2011/0214026 | A1 * | 9/2011 | Rajski et al. | 714/726 |
| 2011/0231722 | A1 * | 9/2011 | Mukherjee et al. | 714/729 |

OTHER PUBLICATIONS

K. De and A. Gunda, "Failure Analysis for Full-Scan Circuits", Proc. Int'l Test Conf., 1995, pp. 636-645.
S. Edirisooriya and G. Edirisooriya, "Diagnosis of Scan Path Failures," Proc. VLSI Test Symp., 1995, pp. 250-255.
R. Guo, and S. Venkataranman, "A Technique for Fault Diagnosis of Defects in Scan Chains," Proc. Int'l Test Conf., 2001, pp. 268-277.
J.-J. Hsu et al., "A New Robust Paradigm for Diagnosing Hold-Time Faults in Scan Chains," Proc. IEEE Int'l Symp. on VLSI Design, Automation and Test, 2006, pp. 171-174.
Y. Huang et al., "Using Fault Model Relaxation to Diagnose Real Scan Chain Defects", Proc. Asia and South Pacific Design Automation Conf., 2005, pp. 1176-1179.
Y. Huang, et al., "Diagnose Compound Scan Chain and System Logic Defects," Proc. Int'l Test Conf., 2007, p. 7.1.
Y. Huang et al., "Scan Chain Diagnosis by Adaptive Signal Profiling with Manufacturing ATPG Patterns," Proc. Asian Test Symp., 2009, pp. 35-40.

(Continued)

*Primary Examiner* — Daniel McMahon
(74) *Attorney, Agent, or Firm* — Klarquist Sparkman, LLP

(57) ABSTRACT

With various implementations of the invention, unloading masking information for each of the scan patterns is first determined. A tester then applies the scan patterns to a circuit under test and collects test response data according to the unloading masking information. A profiling-based analysis is performed to determine failing scan cell information based on the test response data.

18 Claims, 5 Drawing Sheets

(56) References Cited

OTHER PUBLICATIONS

J. Hwang et al., "Deterministic Localization and Analysis of Scan Hold-Time Faults", Proc. Int'l Symp. for Testing and Failure Analysis, 2008, pp. 396-401.

K. Khusyari et al., "Diagnosis of Voltage Dependent Scan Chain Failure Using VBUMP Scan Debug Method", Proc. Asian Test Symp., 2008, pp. 271.

S. Kundu, "On diagnosis of faults in a scan-chain," Proc. VLSI Test Symp., 1993, pp. 303-308.

F.-M. Kuo and Y.-S. Chen, "Yield Ramp up by Scan Chain Diagnosis", Proc. Asian Test Symp., 2009.

J. Schafer et al., "Partner SRLs for Improved Shift Register Diagnostics," Proc. VLSI Test Symp., 1992, pp. 198-201.

P. Song et al., "A Novel Scan Chain Diagnostics Technique Based on Light Emission from Leakage Current," Proc. Int'l Test Conf., 2004, pp. 140-147.

F. Stellair et al., "Broken Scan Chain Diagnostics Based on Time-integrated and Time-Dependent Emission Measurements," Proc. Int'l Symp. for Testing and Failure Analysis, 2004, pp. 52-57.

C.-W. Tzeng et al., "A Robust Paradigm for Diagnosing Hold-Time Faults in Scan Chains," IET Proc. on Computers and Digital Techniques, vol. 1, No. 6, 2007, pp. 706-715.

Y. Wu, "Diagnosis of Scan Chain Failures," Proc. Int'l Symp. on Defect and Fault Tolerance in VLSI Systems, 1998, pp. 217-222.

www.verigy.com, 2008.

J.-S. Yang and S.-Y. Huang, "Quick Scan Chain Diagnosis Using Signal Profiling," Proc. Int'l Conf. on Computer Design, 2005, pp. 157-160.

\* cited by examiner

PROFILING-BASED SCAN CHAIN DIAGNOSIS

RELATED APPLICATIONS

This application claims priority to U.S. Provisional Patent Application No. 61/353,864, entitled "Enhance Profiling-Based Scan Chain Diagnosis by Pattern Masking," filed on Jun. 11, 2010, and naming Wu-Tung Cheng and Yu Huang as inventors, which application is incorporated entirely herein by reference.

FIELD OF THE INVENTION

The present invention is directed to integrated circuit test and diagnosis. Various aspects of the invention may be particularly useful for diagnosing scan chain failures.

BACKGROUND OF THE INVENTION

Overview

Scan-based testing has been widely adopted in digital circuits as it has been proven to be a cost-effective method to achieve good test coverage. Scan elements and clocking may occupy nearly 30% of a chip area. It has been reported that 10-30% detected defects can cause scan chains to fail. As the silicon area occupied by scan chains and their control logic is still increasing and circuit components is continuously shrinking in size, it has become increasingly important to identify which scan cell on a faulty scan chain is defective.

The scan chain diagnosis techniques may be classified into three main categories: tester-based, hardware-based, and software-based diagnosis techniques. Tester-based diagnosis techniques use a tester to control scan chain shift operations. Physical failure analysis (PFA) equipments are sometimes used together with a tester to observe defective responses at different locations and to identify a failing scan cell. These techniques normally provide very good diagnosis resolution. However, they are difficult to apply to chips with embedded compression circuits without resorting bypass mode. It is also difficult to apply these techniques in volume diagnosis environment. Hardware-based methods use specially-designed scan chains and scan cells to facilitate the diagnosis process. These methods are effective in isolating scan chain defects. However, the requirement of extra hardware, the specially-designed scan chains/cells, may not be acceptable in many product designs. Software-based techniques use algorithmic diagnosis procedures to identify failing scan cells. It may run chain diagnosis with conventional scan chains with or without embedded compressions.

The software-based chain diagnosis techniques may be further classified into three categories: model-based, data-driven, and hybrid techniques. In model-based chain diagnosis, fault models and pattern simulation are employed. In data-driven chain diagnosis, signal profiling, filtering and edge detections are applied. These two approaches can be combined to form the hybrid chain diagnosis techniques. For example, the reference of Y. Huang et al., "Scan chain Diagnosis by Adaptive Signal Profiling with Manufacturing ATPG," Proc. Asian Test Symp., 2009, pp. 35-40, which is incorporated herein by reference, discusses applying both model-based simulation of masked scan patterns and statistical analysis of unloading test response data. Details about these three categories are provided below.

Terminologies

Test patterns used in chain diagnosis are often classified into 3 categories: chain patterns, scan patterns, and special chain diagnostic patterns.

A chain pattern (or chain flush pattern) is a test pattern that is used only in shift-in (loading) and shift-out (unloading) processes without pulsing capture clocks during a test. As such, test data of a chain pattern loaded to scan chains are isolated from the functional logic of a circuit under test. By applying chain patterns, scan chain integrity can be tested and faulty scan chains (or defective scan chains) and fault models may be identified.

A scan pattern is a test pattern that is used in shift-in, launch, capture, and shift-out processes. Scan patterns are also referred to as ATPG (Automatic Test Pattern Generation) scan patterns or scan ATPG patterns. Scan patterns are usually used to test and diagnose the functional logic during manufacturing tests. They can also be used in chain test and diagnosis.

A special chain diagnostic pattern is a test pattern generated only for scan chain diagnosis purpose. Special chain diagnostic patterns may include special functional patterns and random patterns generated on-line by a tester (test equipment).

To describe a chain diagnosis method, typically each scan cell in a scan chain is given an index. Without losing generality, the cell connected to scan-output is numbered 0 and the cells in the chain are numbered incrementally from scan-output to scan-input. The scan cells between the scan chain input and the scan input terminal of a scan cell are called the "upstream cells" of the scan cell, while the scan cells between the scan chain output and the scan output terminal of a scan cell are called the "downstream cells" of the scan cell.

Scan chain fault models may be classified into nine categories: slow-to-rise, slow-to-fall, slow, fast-to-rise, fast-to-fall, fast, stuck-at-0, stuck-at-1, and indeterminate faults. Faults in the first three categories are normally caused by setup-time violations while those in the next three categories are normally caused by hold-time violations. With a specific fault model, a scan chain defect can also be modeled as a permanent fault (the fault that happens for all shift cycles) or an intermittent fault (the fault that happens only for a subset of shift cycles). Note that the defect itself is still permanent, but the fault model used to represent the defect is intermittent. For example, an intermittent stuck-at-0 fault refers to a defect that can cause some shift operations to fail as if a stuck-at-0 fault intermittently appears while which shift cycles may fail is not known.

The "noise" is defined as any discrepancy between the real defect behavior and the defect behavior given by a software-based diagnosis system. The sources of the noise include, but not limited to:

(1) discrepancy between a fault model and un-modeled realistic defects, (2) defects that may impact both scan chains, control logic and/or clock systems, (3) errors that are introduced into the failure log, during the failure log's generation/translation/ATE (automatic test equipment) truncation processes, (4) imperfectness/bugs of simulation procedures in EDA (electronic design automation) tools, and (5) unrepeatable test results due to transient effects/testing environment changes.

Model-Based Chain Diagnosis

A model-based chain diagnosis method first identifies faulty scan chains and the corresponding fault models by using chain patterns. Fault simulations are then performed. A fault is algorithmically "injected" to one scan cell on a faulty chain. The loaded values of the downstream cells are accordingly modified for all scan patterns. For example, suppose a scan pattern has good machine loaded value 001110011010 on the faulty chain. If a permanent stuck-at-1 fault is injected on scan cell 8 of this chain, the loaded values will be modified as 00111$\underline{1111111}$. After pulsing the capture clock, the simulated captured values in the upstream of the failing scan cell on this chain will also be modified. For example if the simulated captured value is 101011101011, the unloaded values will be 1$\underline{11}$111101011. The fault simulation is performed one cell at a time. The simulation results are compared with the results observed on the tester (ATE). The cell(s) that matches the best are reported as suspect(s).

The advantages of the fault model and simulation based algorithm include (1) applicability of manufacturing ATPG scan patterns, (2) direct diagnosis without resorting to bypass mode in the case of embedded compression, and (3) good diagnosis resolution and accuracy when the defect can be modeled as permanent faults. The disadvantages include (1) poor diagnosis resolution for intermittent faults and (2) diagnosis results susceptible to noise interference.

Data-Driven Chain Diagnosis

A data-driven chain diagnosis method often uses special chain diagnosis patterns. These patterns could be either functional test patterns that start from an initial state, or scan patterns that start with all "0"s or all "1"s. The purpose of using such patterns is to avoid (or minimize) any faulty values introduced with the loading of scan chains. Therefore, all (or most) of the failing bits are caused in the process of unloading scan chains. Then the diagnosis can be performed by monitoring from which scan cell the signal probability has been significantly changed. These algorithms select scan patterns to randomize signal probability of scan cells before unloading. The failing scan cell position can be identified by comparing the observed signal profile on a tester and the expected signal profile.

The advantages of the data-driven algorithm include (1) good diagnosis accuracy even if the realistic defect's behavior is difficult to model, (2) no requirement of design information, (3) tolerance to noises, and (4) fast diagnosis speed because it does not rely on pattern simulations for each cell of a faulty scan chain. The disadvantages include: (1) Manufacturing ATPG scan patterns cannot be used because the faulty values during scan chain loading procedures could be propagated to the faulty chain itself which would compromise signal profiling results; and (2) it cannot apply to circuits with embedded compression logic without using bypass mode.

Hybrid Chain Diagnosis

As noted previously, a hybrid approach combines model-based techniques and data-driven techniques. The combination allows manufacturing ATPG scan patterns to be utilized for chain diagnosis. Manufacturing ATPG scan patterns are preferred in a practical chain diagnosis application because these scan patterns usually generated for testing circuits during manufacturing processes are readily available. If the diagnosis result from applying manufacturing ATPG scan patterns is not satisfactory, additional diagnostic patterns may be created.

The hybrid chain diagnosis approach often uses masking techniques to avoid or minimize any faulty values introduced during loading scan patterns to scan chains. One of the masking techniques is the X-masking technique. This technique identifies sensitive loading bits for each scan pattern and replaces each of them with an "X". A sensitive loading bit of a test pattern corresponds to a scan cell of which a loaded value can be different from the good-machine loaded value due to a defect or defects existing in the scan chain. For different fault models, the sensitive loading bits may be different. For example, suppose a scan pattern has a good machine loaded value 001110011010 on the faulty chain. If a stuck-at-1 fault is identified, all "0"s are sensitive loading bits. The X-masking technique will replace "0"s with "X"s and thus the loaded value will become XX111XX11X1X. If a fast-to-rise fault is identified instead, all "0"s within the "10" transitions will become sensitive loading bits, and the loaded value will be changed to "00111X011X1X".

Once scan patterns are X-masked, simulations may be performed to derive expected unloading values. Based on the expected unloading values and the observed unloading values (test response data collected after applying the scan patterns), failing probabilities for scan cells in a faulty scan chain are calculated and failing scan cells may be identified.

The hybrid chain diagnosis techniques and the data-driven chain diagnosis techniques together are referred to as profiling-based chain diagnosis techniques.

BRIEF SUMMARY OF THE INVENTION

Aspects of the invention relate to profiling-based scan chain diagnosis techniques. With various implementations of the invention, unloading masking information for each of scan patterns is first determined. A tester then applies the scan patterns to a circuit under test and collects test response data based on the unloading masking information. A profiling-based analysis is performed to determine failing scan cell information based on the test response data. Some embodiments of the invention employ a generic masking diagnosis flow. Some other embodiments of the invention employ an adaptive masking diagnosis flow.

DETAILED DESCRIPTION OF THE INVENTION

Figure 1:
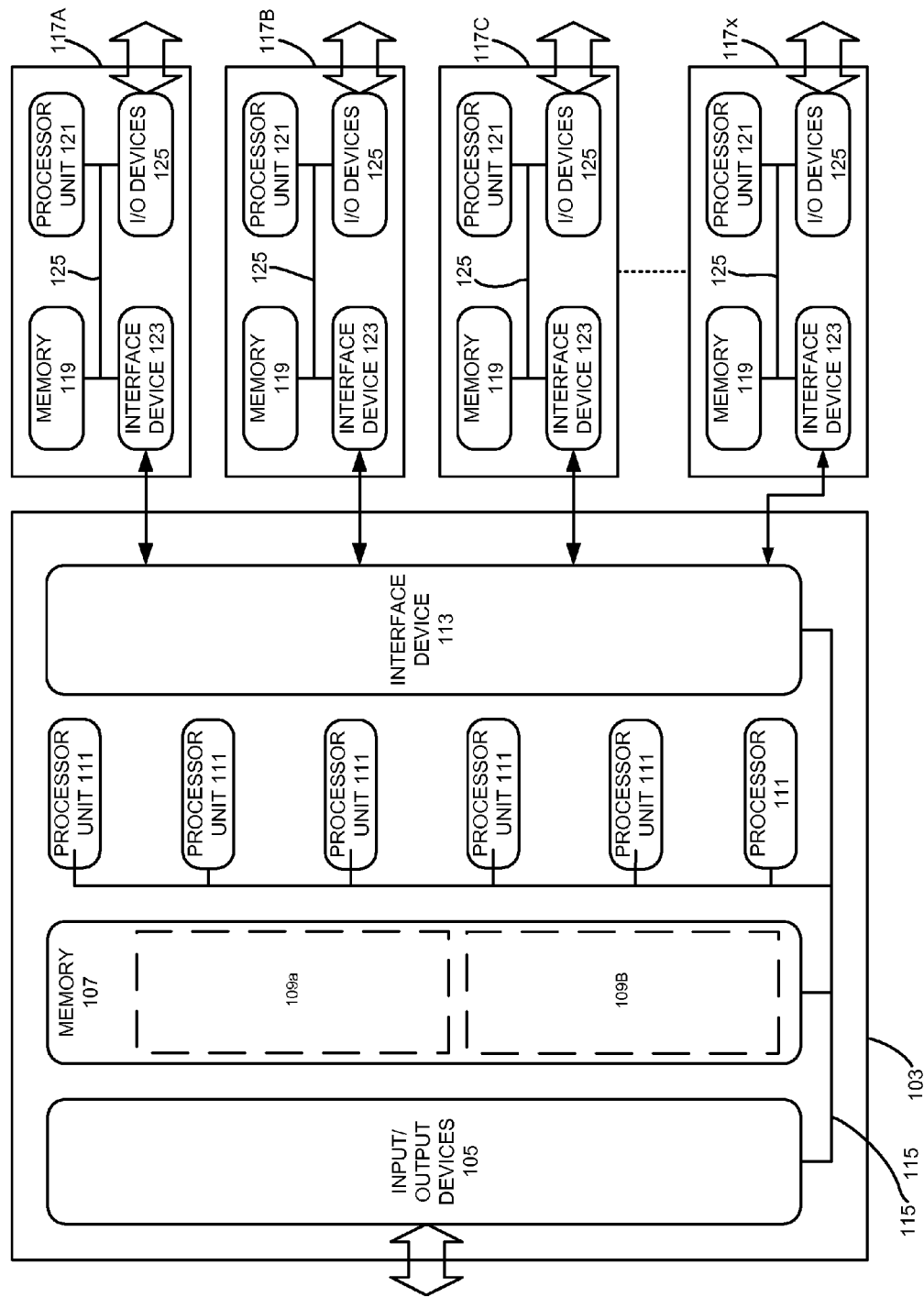
FIG. 1 illustrates a programmable computer system with which various embodiments of the invention may be employed.

Various aspects of the present invention relate to profiling-based chain diagnosis techniques. In the following description, numerous details are set forth for purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine," "mask," and "collect" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Exemplary Computing Environment

The execution of various electronic design automation processes may be implemented using computer-executable software instructions executed by one or more programmable computing devices. Because these examples of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or slave computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
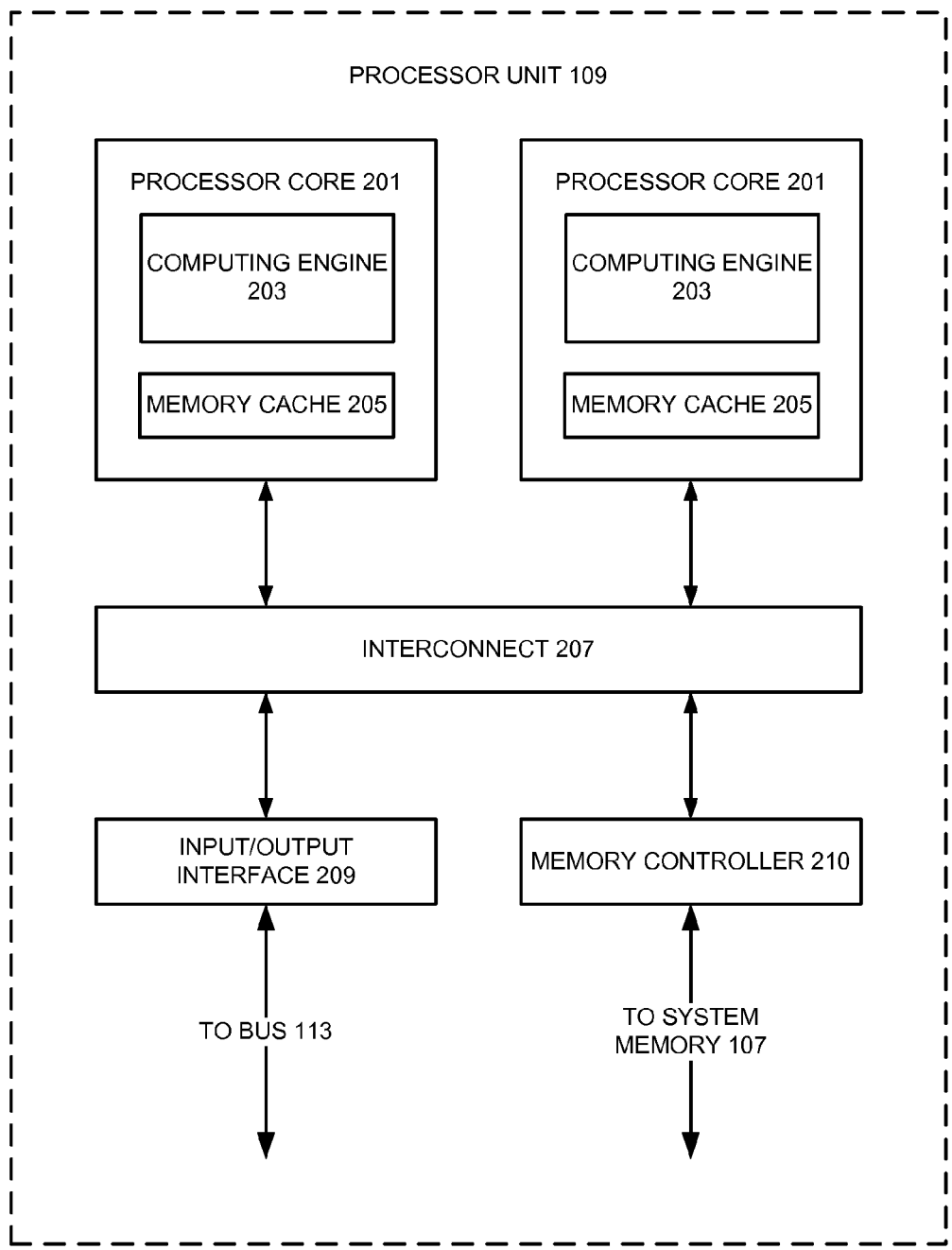
FIG. 2 illustrates a process for scan chain diagnosis in accordance with an embodiment of the present invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the slave computers 117A, 1157, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the slave computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 117 may include a memory 119, a processor unit 121, an interface device 122, and, optionally, one more input/output devices 125 connected together by a system bus 127. As with the master computer 103, the optional input/output devices 125 for the slave computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the slave computers 117 to communicate with the master computer 103 over the communication interface.

In the illustrated example, the master computer 103 is a multi-processor unit computer with multiple processor units 111, while each slave computer 117 has a single processor unit 121. It should be noted, however, that alternate implementations of the invention may employ a master computer having single processor unit 111. Further, one or more of the slave computers 117 may have multiple processor units 121, depending upon their intended use, as previously discussed. Also, while only a single interface device 113 or 123 is illustrated for both the master computer 103 and the slave computers, it should be noted that, with alternate embodiments of the invention, either the computer 103, one or more of the slave computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 117 may alternately or additions be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Unloading Masking Information

The profiling-based chain diagnosis techniques usually use a statistical method. To achieve a certain diagnosis resolution, a large amount of test response data is needed. A defect on a scan chain could easily cause about 50% of total flops on that chain to fail on ATE. Consider a faulty scan chain that has 10,000 flops. A fail log of over 500,000 shift cycles may result if 100 failing patterns are logged. Collecting this amount of data in a failure analysis lab may take minutes to hours depending on the test platform used. This may be acceptable in the failure analysis lab environment. In the volume production test environment, however, it is often not feasible to collect so many failing cycles of data needed for the profiling based chain diagnosis. Besides the test time factor, the size of the ATE failure buffer presents another constraint limiting the number of scan patterns that can be applied during an operation.

Fortunately, not all of the test response data need to be collected for the diagnosis process. Similar to sensitive loading bits of a test pattern, some bits of an unloaded test response value may be sensitive to defects on faulty scan chains while others are not. A sensitive unloading bit here corresponds to a scan cell of which the unloaded value may be different from the expected value due to a defect on the scan chain. This scan cell is called as a sensitive scan cell. In fact, a sensitive scan cell also corresponds to a sensitive loading bit of a scan pattern. Like sensitive loading bits, different fault models may have different sensitive unloading bits. For example, suppose a scan pattern has expected unloaded test response value 001110011010 on a faulty chain. If this chain has a "stuck-at-1" fault, all "0"s in the expected unloaded value are sensitive unloading bits. Assuming a "fast-to-rise" fault is instead on this faulty chain, all "0"s within a "10" transition of a cell pair are sensitive unloading bits. For designs with embedded compactor, a sensitive unloading bit also requires it contribute to the observed compacted value at the compactor channel output.

The profiling-based diagnosis techniques usually determine how many times sensitive unloading bits are observed to be failing bits and use that information to identify failing scan cells. This is because non-sensitive unloading bits are not affected by defects on faulty scan chains and their failing probabilities should be 0. Hence, test response data for non-sensitive unloading bits are usually not needed for the profiling-based chain diagnosis techniques. All or some of these non-sensitive unloading bits may be masked (or not collected) when a tester is collecting test response data. The information that can be used to guide a tester to collect a certain portion of test response data is referred to as unloading masking information.

Scan Chain Diagnosis System

Figure 3:
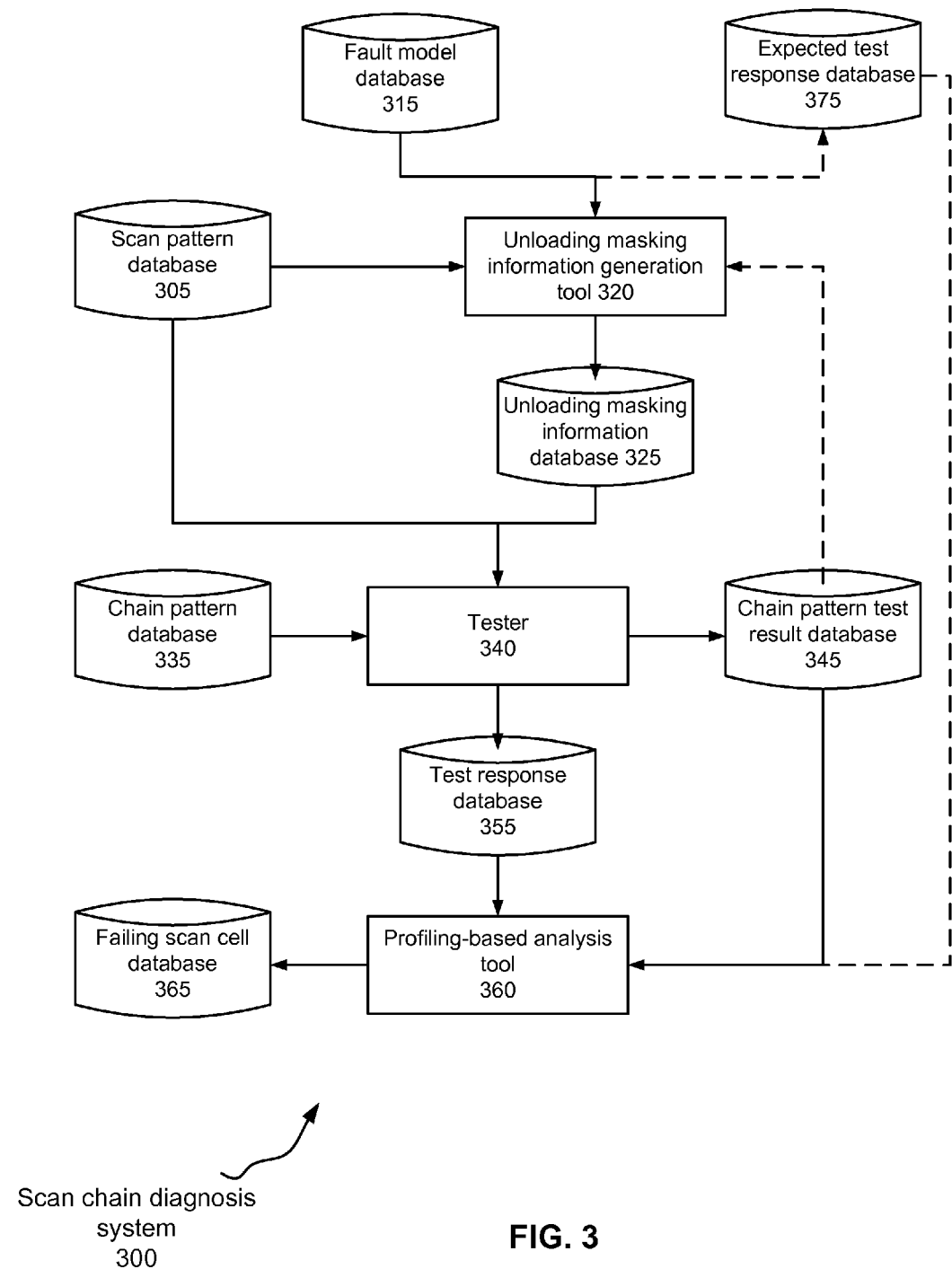
FIG. 3 illustrates an example of a scan chain diagnosis system in accordance with an embodiment of the present invention.

FIG. 3 illustrates an example of a scan chain diagnosis system 300 that may be provided according to various embodiments of the invention. As seen in this figure, the scan chain diagnosis system 300 includes an unloading masking information generation tool 320, a tester 340 and a profiling-based analysis tool 360. As will be discussed in more detail below, some implementations of the scan chain diagnosis system 300 may cooperate with (or incorporated) one or more of a scan pattern database 305, a fault model database 315, an unloading masking information database 325, a chain pattern database 335, a chain pattern test result database 345, a test response database 355, a failing scan cell database 365 and an expected test response database 375.

According to some embodiments of the invention, one or both of the masking information generation tool 320 and the profiling-based analysis tool 360 may be implemented by one or more computing systems, such as the computing system illustrated in FIG. 1 and FIG. 2, executing programmable instructions. Correspondingly, some other embodiments of the invention may be implemented by software-executable instructions, stored on a computer-readable medium, for instructing a computing system to perform functions of one or both of the unloading masking information generation tool 320 and the profiling-based analysis tool 360. The computer-readable medium may be, for example, a magnetic storage device, an optical storage device, a "punched" surface type device, or a solid state storage device. While the scan pattern database 305, the fault model database 315, the unloading masking information database 325, the chain pattern database 335, the chain pattern test result database 345, the test response database 355, the failing scan cell database 365 and the expected test response database 375 are shown as separate units in FIG. 3, a single computer-readable medium may be used to implement some or all of these databases.

As will be discussed in more detail below, the unloading masking information generation tool 320 is configured to determine unloading masking information for each of scan patterns provided. The scan patterns may be received from the scan pattern database 305 and the determined unloading masking information may be stored in the unloading masking information database 325.

Figure 4:
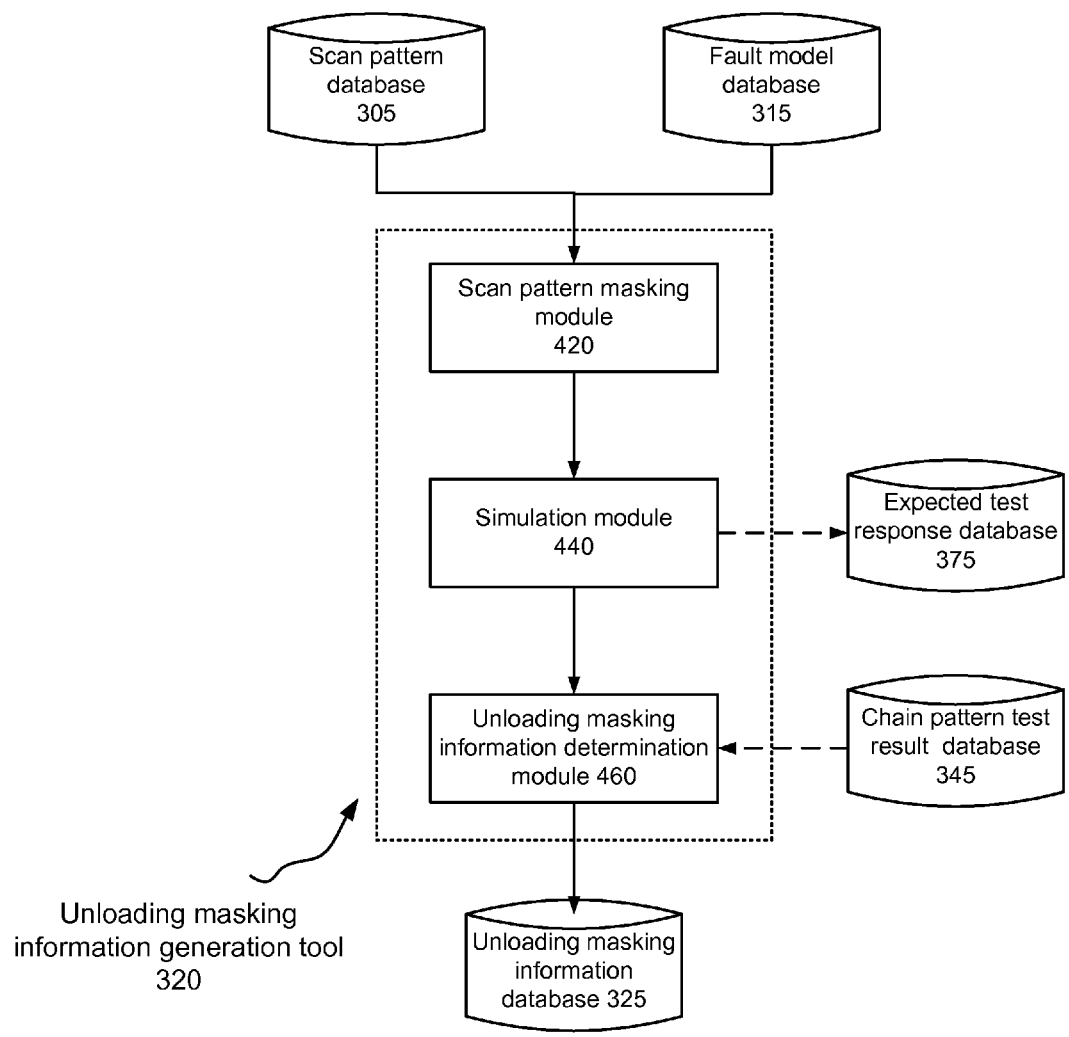
FIG. 4 illustrates an example of an unloading masking information generation tool in accordance with an embodiment of the present invention.

According to some embodiments of the invention, the unloading masking information generation tool 320 comprises, as shown in FIG. 4, three modules: a scan pattern masking module 420, a simulation module 440 and an unloading masking information determination module 460. The scan pattern masking module 420 is configured to mask sensitive loading bits of a scan pattern to generate a masked scan pattern. The simulation module 440 is configured to simulate the masked scan pattern. The unloading masking information determination module 460 is configured to identify sensitive unloading bits or general sensitive unloading bits for the scan pattern based on the simulation results.

The tester 340 is configured to apply test patterns (including scan patterns, chain patterns and special chain diagnostic patterns) to a circuit under test. When scan patterns are used, the tester 340 collects test response data based on the unloading masking information for each of the scan patterns generated by the unloading masking information generation tool 320. The collected test response data may be stored in the test response database 355. A tester can be implemented by a conventional commercial ATE or any test platforms.

Figure 5:
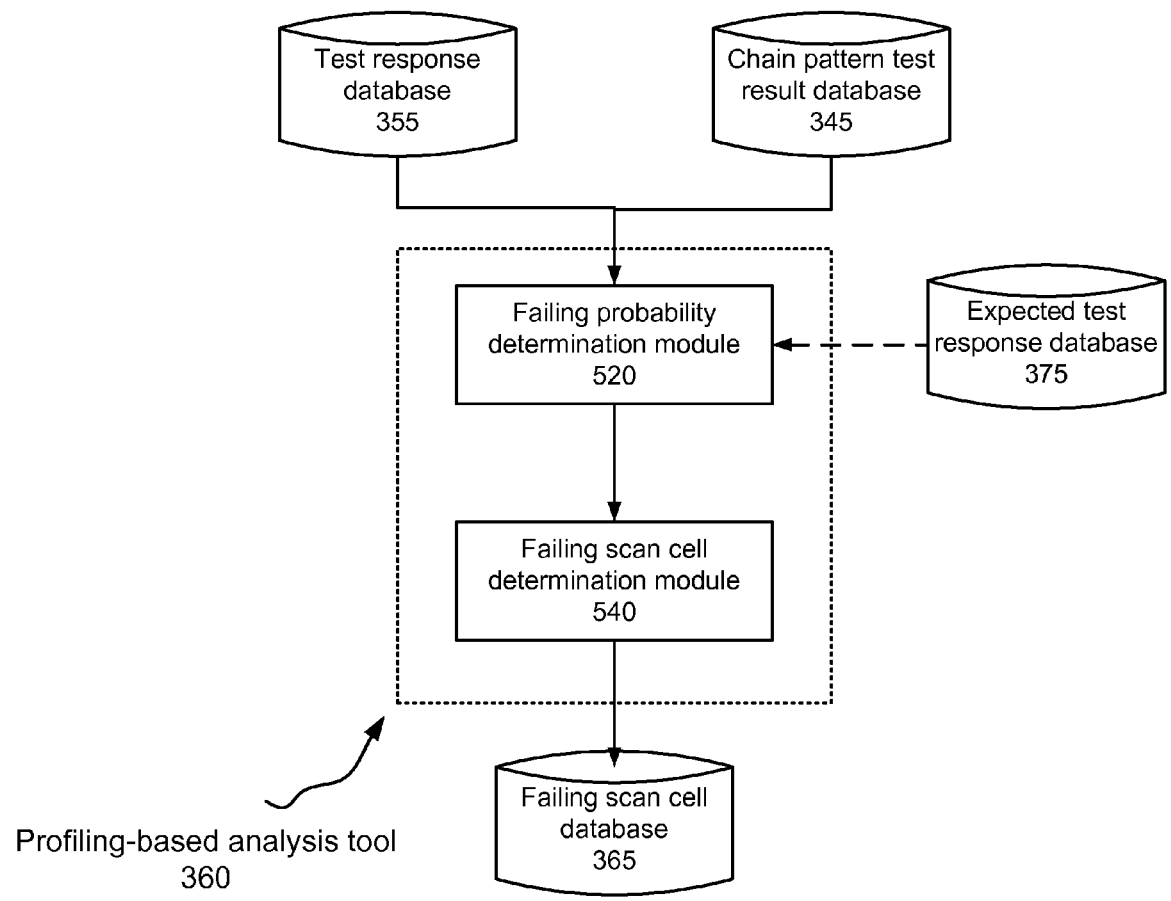
FIG. 5 illustrates an example of a profiling-based analysis tool in accordance with an embodiment of the present invention.

As will be discussed in more detail below, the profiling-based analysis tool 360 is configured to perform a profiling-based analysis to determine failing scan cell information based on the collected test response data. According to some embodiments of the invention, the profiling-based analysis tool 360 comprises, as shown in FIG. 5, two modules: a failing probability determination module 520 and a failing scan cell determination module 540. The failing probability determination module 520 is configured to determine scan cell failing probability information for one or more faulty scan chains based on the test response data. The failing scan cell determination module 540 is configured to determine failing scan cell information based on the scan cell failing probability information.

Generic Masking Diagnosis Flow and Adaptive Masking Diagnosis Flow

For purposes of explanation, scan chain diagnosis methods according to some embodiments of the invention will be described with reference to the scan chain diagnosis system 300 discussed earlier. It should be appreciated that the scan chain diagnosis methods described below may be implemented with a different system according to various embodiments of the invention. Likewise, it should be appreciated that the scan chain diagnosis system 300 shown in FIG. 3 or in other configurations may be used to perform methods according to various embodiments of the invention different from those described below.

The scan chain diagnosis methods to be described may be classified into two categories: a generic masking diagnosis flow and an adaptive masking diagnosis flow. The two flows share a general scheme. First, the unloading masking information generation tool 320 determines unloading masking information for each of scan patterns. The tester 340 applies the scan patterns to a circuit under test and collect test response data based on the unloading masking information for each of the scan patterns. The profiling-based analysis tool 360 then analyzes the collected test response data to determine failing scan cell information.

One of the major differences between the generic and adaptive masking diagnosis flows lies in the unloading masking information. In the generic masking diagnosis flow, the unloading masking information generation tool 320 is configured to identify general sensitive unloading bits for each of the scan patterns and store the information about these bits in the unloading masking information database. The general sensitive unloading bits comprise sensitive unloading bits for each of a plurality of fault models under consideration. If a scan cell is sensitive to any of the plurality of fault models, the corresponding bit of the unloaded test response data is a general sensitive unloading bit. The general sensitive unloading bits can thus be derived by merging all sensitive unloading bits for the plurality of fault models.

To identify the sensitive unloading bits for the plurality of fault models, the unloading masking information generation tool 320 may adopt a configuration as illustrated in FIG. 4. Under this configuration, the scan pattern masking module 420 first masks sensitive loading bits of a scan pattern for a scan chain according to a fault model. The simulation module 440 then simulates the masked scan pattern to derive expected test response data. Based on the expected test response data, the unloading masking information determination module 460 identifies sensitive unloading bits for the scan chain. The above three operations are repeated for each of the scan chains to identify sensitive unloading bits for the fault model for the scan pattern. The whole process is then repeated for each of the plurality of fault models. Once the sensitive unloading bits for each of the plurality of fault models are determined, the unloading masking information determination module 460 merges them to derive general sensitive unloading bits for the scan pattern. It should be appreciated that the above process is equivalent to one of determining non-sensitive unloading bits for all of the plurality of fault models.

The derived unloading masking information is used by the tester 340 to collect test response data. In the generic masking diagnosis flow, the tester 340 only collect test response data for the identified general sensitive unloading bits and ignore the other bits for a scan pattern. Based on the test response data for the general sensitive unloading bits for a plurality of scan patterns, the profiling-based analysis tool 360 determines failing scan cell information. With various implementations of the invention, the profiling-based analysis tool 360 may be configured according to the configuration shown in FIG. 5. In this configuration, the failing probability determination module 520 determines scan cell failing probability information based on the collected test response data and corresponding expected test response data. As noted above, the simulation module 440 calculates the expected test response data. These data may be saved in the expected test response database 375 for the failing probability determination module 520 to use. Alternatively, the failing probability determination module 520 can derive the expected test response data by itself in a similar way: first masking sensitive loading bits of a scan pattern and then simulating the masked scan pattern. It should be appreciated that the expected test response data may be determined with various other methods depending upon the test patterns applied and/or the profiling-based chain diagnosis technique employed.

With various implementations of the invention, the tester 340 may also apply chain patterns to the circuit under test to collect a failure log. The profiling-based analysis tool 360 or a different tool can determine faulty scan chain information based on the failure log. The faulty scan chain information may include information about which scan chains are faulty scan chains and which fault models can be associated with faulty scan chains. The profiling-based analysis tool 360 can use the faulty scan chain information to assist the analysis of the test response data and/or incorporate the faulty scan chain information into the failing scan cell information. For example, the failing probability determination module 520 may determine scan cell failing probabilities only for the identified faulty scan chains. Based on the scan cell failing probability information, the failing scan cell determination module 540 identifies failing scan cell candidates. The result may be stored in the database failing scan cell database 365 and/or displayed on a tangible medium.

In the adaptive masking diagnosis flow, the unloading masking information generation tool 320 is configured, according to some embodiments of the invention, to identify adaptive general sensitive unloading bits for each of the scan patterns and store the information about these bits in the unloading masking information database 325. The adaptive general sensitive unloading bits are a subset of the general sensitive unloading bits corresponding to scan cells only on the known faulty scan chains. Hence, the unloading masking information generation tool 320 needs the faulty scan chain information. As described above, the tester 340 may be used for deriving a failure log. Either the tool 320 or a different tool can then determine the faulty scan chain information based on the failure log. Because the adaptive general sensitive bits are a subset of the general sensitive bits, the tester 340 in the adaptive masking diagnosis flow collects a smaller size of test response data for each of the scan patterns than in the generic masking diagnosis flow.

The size of test response data that need to be collected by the tester 340 may be further reduced. According to some other embodiments of the invention, the unloading masking information generation tool 320 is configured to identify adaptive sensitive unloading bits for each of the scan patterns and store the information about these bits in the unloading masking information database. The adaptive sensitive unloading bits are the sensitive unloading bits corresponding to scan cells on the faulty scan chains. Thus, the unloading masking information generation tool 320 needs to know not only which scan chains have failed but also which fault models are associated with the faulty scan chains. While the tester can collect even less test response data using the information of adaptive sensitive unloading bits, this approach may not be a better approach considering the available fault models may not be accurate enough occasionally to represent the defect behavior observed.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. A method of scan chain diagnosis, executed by at least one processor of a computer, comprising:
    by a tester that is separate from a circuit under test:
        applying scan patterns to the circuit under test;
        based on unloading masking information, collecting test response data from the circuit under test for sensitive unloading bits and not collecting test response data from the circuit under test for at least some non-sensitive unloading bits;
        performing a profiling-based analysis to determine failing scan cell information based on the test response data for sensitive unloading bits; and
        storing the failing scan cell information in a tangible processor-accessible medium, or displaying the failing scan cell information on a tangible medium.

2. The method recited in claim 1, wherein the unloading masking information for each of the scan patterns is determined by a method of unloading masking information generation, the method of unloading masking information generation comprising:
    masking sensitive loading bits to generate a masked scan pattern for each of the scan chains for each of a plurality of fault models for each of the scan patterns;
    simulating the masked scan pattern for each of scan chains for each of the plurality of fault models for each of the scan patterns;
    identifying the sensitive unloading bits for each of the plurality of fault models for each of the scan patterns based on results of the simulating;
    determining general sensitive unloading bits for each of the scan patterns by combining the sensitive unloading bits for each of the plurality of fault models for each of the scan patterns; and
    storing information of the general sensitive unloading bits for each of the scan patterns as the unloading masking information for each of the scan patterns in a tangible processor-accessible medium.

3. The method recited in claim 1, wherein the unloading masking information for each of the scan patterns is determined by a method of unloading masking information generation, the method of unloading masking information generation comprising:
    masking sensitive loading bits to generate a masked scan pattern for each of the scan chains for each of a plurality of fault models for each of the scan patterns;
    simulating the masked scan pattern for each of scan chains for each of the plurality of fault models for each of the scan patterns; and
    identifying the sensitive unloading bits for each of the scan chains for each of the plurality of fault models for each of the scan patterns based on results of the simulating.

4. The method recited in claim 3, wherein the method of unloading masking information generation further comprises:
    determining, based on faulty scan chain information, adaptive sensitive unloading bits for each of the scan patterns from the sensitive unloading bits for each of the scan chains for each of the plurality of fault models for each of the scan patterns; and
    storing information of the adaptive sensitive unloading bits for each of the scan patterns as the unloading masking information for each of the scan patterns in a tangible processor-accessible medium.

5. The method recited in claim 3, wherein the method of unloading masking information generation further comprises:
    determining general sensitive unloading bits for each of the scan chains for each of the scan patterns by combining the sensitive unloading bits for each of the scan chain for each of the plurality of fault models for each of the scan patterns;
    determining, based on faulty scan chain information, adaptive general sensitive unloading bits for each of the scan patterns from the general sensitive unloading bits for each of the scan chains for each of the scan patterns; and
    storing information of the adaptive general sensitive unloading bits for each of the scan patterns as the unloading masking information for each of the scan patterns in a tangible processor-accessible medium.

6. The method recited in claim 5, wherein the faulty scan chain information is generated by applying chain patterns to the circuit under test.

7. The method recited in claim 1, wherein the performing profiling-based analysis comprises:
    determining scan cell failing probability information for one or more faulty scan chains of the circuit under test based on the test response data for each of the scan patterns and expected test response data for each of the scan patterns; and
    determining failing scan cell information based on the scan cell failing probability information.

8. The method recited in claim 7, wherein the one or more faulty scan chains are determined by applying chain patterns to the circuit under test.

9. The method recited in claim 7, wherein the expected test response data are derived by a masking simulation method, the masking simulation method comprises:
    masking sensitive loading bits for each of the scan patterns; and
    simulating each of masked scan patterns.

10. One or more computer-readable storage devices storing computer-executable instructions which when executed by a computer cause the computer to perform a method of scan chain diagnosis, the method comprising:
    by a tester that is separate from a circuit under test:
        applying scan patterns to the circuit under test;
        based on unloading masking information, collecting test response data from the circuit under test for sensitive unloading bits and not collecting test response data from the circuit under test for at least some non-sensitive unloading bits; and
        performing a profiling-based analysis to determine failing scan cell information based on the test response data for sensitive unloading bits.

11. The one or more computer-readable storage devices of claim 10, wherein the unloading masking information for each of the scan patterns is determined by a method of unloading masking information generation, the method of unloading masking information generation comprising:

masking sensitive loading bits to generate a masked scan pattern for each of the scan chains for each of a plurality of fault models for each of the scan patterns;

simulating the masked scan pattern for each of scan chains for each of the plurality of fault models for each of the scan patterns;

identifying the sensitive unloading bits for each of the plurality of fault models for each of the scan patterns based on results of the simulating; and determining general sensitive unloading bits for each of the scan patterns by combining the sensitive unloading bits for each of the plurality of fault models for each of the scan patterns.

12. The one or more computer-readable storage devices of claim 10, wherein the unloading masking information for each of the scan patterns is determined by a method of unloading masking information generation, the method of unloading masking information generation comprising:

masking sensitive loading bits to generate a masked scan pattern for each of the scan chains for each of a plurality of fault models for each of the scan patterns;

simulating the masked scan pattern for each of scan chains for each of the plurality of fault models for each of the scan patterns; and identifying the sensitive unloading bits for each of the scan chains for each of the plurality of fault models for each of the scan patterns based on results of the simulating.

13. The one or more computer-readable storage devices of claim 12, wherein the method of unloading masking information generation further comprises:

determining, based on faulty scan chain information, adaptive sensitive unloading bits for each of the scan patterns from the sensitive unloading bits for each of the scan chains for each of the plurality of fault models for each of the scan patterns; and storing information of the adaptive sensitive unloading bits for each of the scan patterns as the unloading masking information for each of the scan patterns in a tangible processor-accessible medium.

14. The one or more computer-readable storage devices of claim 12, wherein the method of unloading masking information generation further comprises:

determining general sensitive unloading bits for each of the scan chains for each of the scan patterns by combining the sensitive unloading bits for each of the scan chain for each of the plurality of fault models for each of the scan patterns;

determining, based on faulty scan chain information, adaptive general sensitive unloading bits for each of the scan patterns from the general sensitive unloading bits for each of the scan chains for each of the scan patterns; and storing information of the adaptive general sensitive unloading bits for each of the scan patterns as the unloading masking information for each of the scan patterns in a tangible processor-accessible medium.

15. The one or more computer-readable storage devices of claim 14, wherein the faulty scan chain information is generated by applying chain patterns to the circuit under test.

16. The one or more computer-readable storage devices of claim 10, wherein the performing profiling-based analysis comprises:

determining scan cell failing probability information for one or more faulty scan chains of the circuit under test based on the test response data for each of the scan patterns and expected test response data for each of the scan patterns; and determining failing scan cell information based on the scan cell failing probability information.

17. The one or more computer-readable storage devices of claim 16, wherein the one or more faulty scan chains are determined by applying chain patterns to the circuit under test.

18. The one or more computer-readable storage devices of claim 17, wherein the expected test response data are derived by a masking simulation method, the masking simulation method comprises:

masking sensitive loading bits for each of the scan patterns; and simulating each of masked scan patterns.

* * * * *